United States Patent
Chuang et al.

(10) Patent No.: US 8,318,513 B2
(45) Date of Patent: Nov. 27, 2012

(54) METHOD OF ENCAPSULATING LIGHT-EMITTING DIODE DEVICES USING BENT FRAMES

(75) Inventors: Chien-Te Chuang, Taipei County (TW); Chih-Hung Hsu, Taipei County (TW)

(73) Assignee: Everlight Electronics Co., Ltd., Taipei (TW)

( * ) Notice: Subject to any disclaimer, the term of this patent is extended or adjusted under 35 U.S.C. 154(b) by 202 days.

(21) Appl. No.: 12/634,115

(22) Filed: Dec. 9, 2009

(65) Prior Publication Data
US 2011/0081736 A1 Apr. 7, 2011

(30) Foreign Application Priority Data
Oct. 2, 2009 (TW) .............................. 98133550 A (51) Int. Cl.
*H01L 21/56* (2006.01)
*H01L 21/58* (2006.01)
*H01L 21/60* (2006.01)
(52) U.S. Cl. .................. 438/26; 438/124; 257/E21.504
(58) Field of Classification Search .................. 438/416, 438/34, 112, 33, 611, 123, 124, 25–29, 571–572; 257/95, 676, 98–100, 81; 361/805, 806, 361/813
See application file for complete search history.

(56) References Cited

U.S. PATENT DOCUMENTS

| | | | | |
|---|---|---|---|---|
| 4,129,682 A | | 12/1978 | Stewart et al. | |
| 4,949,156 A | * | 8/1990 | Mii | 257/88 |
| 4,979,017 A | * | 12/1990 | Mii | 257/676 |
| 4,984,057 A | * | 1/1991 | Mii | 257/692 |
| 5,455,199 A | * | 10/1995 | Sakamoto | 438/26 |
| 6,407,411 B1 | * | 6/2002 | Wojnarowski et al. | 257/99 |
| 6,652,795 B2 | * | 11/2003 | Konishi et al. | 264/272.13 |
| 2007/0158670 A1 | | 7/2007 | Komoto et al. | |
| 2008/0063738 A1 | | 3/2008 | Lin et al. | |

FOREIGN PATENT DOCUMENTS

| | | |
|---|---|---|
| CN | 101071833 A | 11/2007 |
| CN | 102044448 B | 5/2011 |
| EP | 0468139 A2 | 1/1992 |
| EP | 0468341 A1 | 1/1992 |
| JP | 405136463 A * | 6/1993 |
| JP | 2005188030 A | 7/2005 |
| JP | 2005221563 A | 8/2005 |
| JP | 2008-192929-1 | 8/2008 |

* cited by examiner

*Primary Examiner* — Matthew W Such
*Assistant Examiner* — Abbigale Boyle
(74) *Attorney, Agent, or Firm* — Muncy, Geissler, Olds & Lowe, PLLC (57) ABSTRACT

A method for manufacturing light-emitting diode devices. Multiple metal frames are provided. The metal frames are adjacent to each other and are arranged on a same plane. Each metal frame includes a first connection pin and a second connection pin. A light-emitting diode chip is disposed on and electrically connected to each metal frame. The metal frames are respectively bent, enabling the adjacent metal frames to separate from each other. A moldboard formed with a plurality of mold cavities is provided. The bent metal frames are respectively disposed in the mold cavities, locating each light-emitting diode chip in each mold cavity. The mold cavities are respectively filled with package gel. The package gel filled in each mold cavity covers each light-emitting diode chip. The package gel is solidified. The mold cavities are separated from the package gel. The metal frames are separated from each other, forming the light-emitting diode devices.

11 Claims, 10 Drawing Sheets

METHOD OF ENCAPSULATING LIGHT-EMITTING DIODE DEVICES USING BENT FRAMES

CROSS REFERENCE TO RELATED APPLICATIONS

This Application claims priority of Taiwan Patent Application No. 98133550, filed on Oct. 2, 2009, the entirety of which is incorporated by reference herein.

BACKGROUND OF THE INVENTION

1. Field of the Invention

The invention relates to a method for manufacturing light-emitting diode devices, and more particularly to a manufacturing method that can increase manufacturing yield of the light-emitting diode devices.

2. Description of the Related Art

Generally, a process for manufacturing light-emitting diode devices sequentially comprises the steps of fixing light-emitting diode (LED) chips to metal frames, connection of metal wires, filling of package gel, separating the LED chips from molds, cutting the metal frames to form multiple LED devices, and packaging the LED devices.

Figure 1:
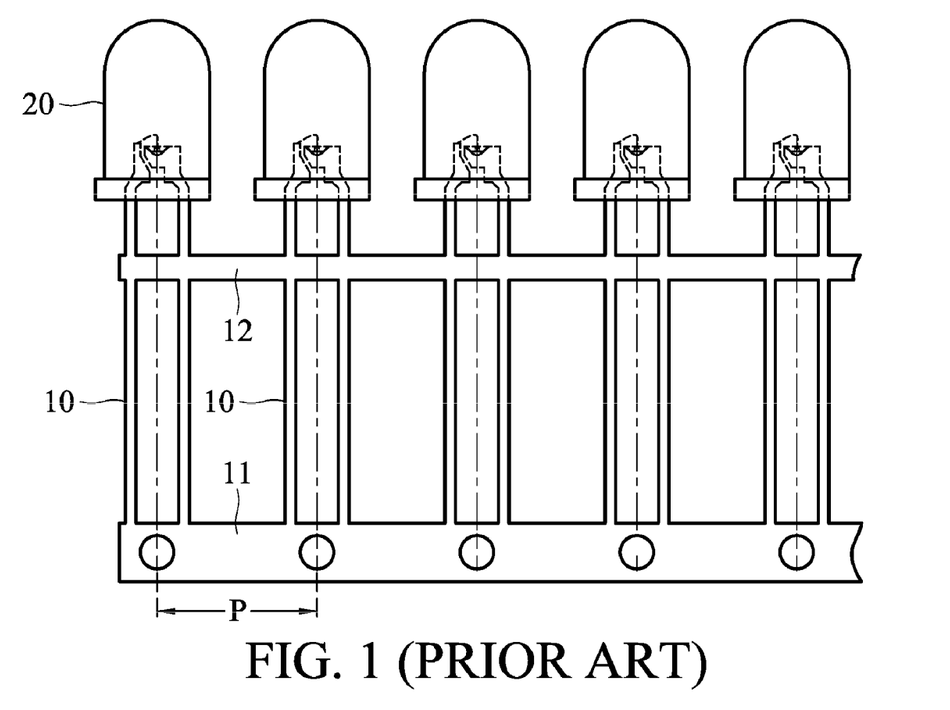
FIG. 1 is a schematic view showing conventional manufacturing of light-emitting diode devices.

In a conventional method for manufacturing LED devices, as shown in FIG. 1, multiple metal frames 10 are connected to each other on a straight line. To conform to the size of mold cavities (not shown) for receiving package gel 20, the distance P between the metal frames 10 must be maintained within a specific range. Otherwise, interference may occur between the mold cavities. Specifically, the larger the number of the metal frames 10, the greater the quantity of the material of a first metal connection portion 11 and a second metal connection portion 12 used for connecting the metal frames 10. Accordingly, the increased quantity of the material of the first metal connection portion 11 and second metal connection portion 12 increases material waste, such that manufacturing costs of the LED devices cannot be reduced.

Hence, there is a need for a new method for manufacturing light-emitting diode devices, wherein manufacturing yield of the light-emitting diode devices is increased to reduce manufacturing costs thereof.

BRIEF SUMMARY OF THE INVENTION

A detailed description is given in the following embodiments with reference to the accompanying drawings.

An exemplary embodiment of the invention provides a method for manufacturing light-emitting diode devices. The method comprises: providing a plurality of metal frames, wherein the metal frames are adjacent to each other and are arranged on a same plane, and each metal frame comprises a first connection pin and a second connection pin; disposing a light-emitting diode chip on each metal frame and electrically connecting each light-emitting diode chip to each metal frame; respectively bending the metal frames to enable the adjacent metal frames to separate from each other; providing a moldboard formed with a plurality of mold cavities; respectively disposing the bent metal frames in the mold cavities to locate each light-emitting diode chip in each mold cavity; respectively filling the mold cavities with package gel, wherein the package gel filled in each mold cavity covers each light-emitting diode chip; solidifying the package gel; separating each mold cavity from the package gel; and separating the metal frames from each other to form the light-emitting diode devices.

The method further comprises binding the first connection pin of each metal frame to the second connection pin thereof with an adhesive.

The metal frames are connected to each other by a first metal connection portion and a second metal connection portion.

The method further comprises steps, for respectively bending the metal frames, of: bending each metal frame at a position near the second metal connection portion; and bending each metal frame at a position near a third metal connection portion connecting the first connection pin to the second connection pin.

When one of the adjacent metal frames is bent with respect to the plane in a first direction, the other of the adjacent metal frames is bent with respect to the plane in a second direction. The first direction is opposite to the second direction.

When one of the adjacent metal frames is bent with respect to the plane in a first direction, the other of the adjacent metal frames is bent with respect to the plane in a second direction. The first direction is the same as the second direction.

When one of the adjacent metal frames is bent with respect to the plane in a first direction, the other of the adjacent metal frames is not bent with respect to the plane.

The bent metal frames have the substantially same height.

Two electrodes of each light-emitting diode chip are electrically connected to the first and second connection pins of each metal frame, respectively.

Each light-emitting diode chip is disposed on the first connection pin of each metal frame and is electrically connected to the second connection pin of each metal frame by a metal wire.

The method further comprises straightening the metal frames of the light-emitting diode devices.

The method further comprises cutting off the metal frames of the light-emitting diode devices.

For solidifying the package gel, the package gel is solidified by roast or ultraviolet irradiation.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The following detailed description is directed to a method for manufacturing light-emitting diode (LED) devices.

Figure 2:
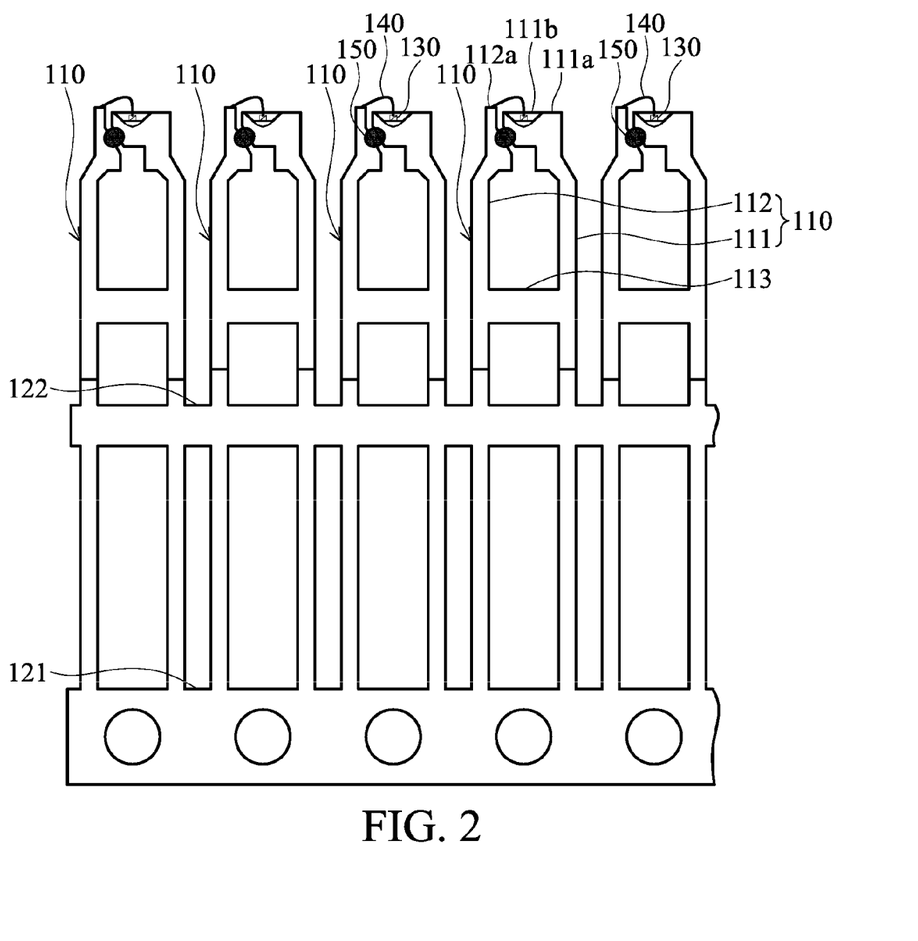
FIG. 2 is a schematic plane view of a plurality of metal frames.

Referring to FIG. 2, a plurality of metal frames 110 is provided. Here, the metal frames 110 are arranged on a same plane and are adjacent to each other equidistantly and in parallel. Specifically, the metal frames 110 are connected to each other by a first metal connection portion 121 and a second metal connection portion 122. Moreover, each metal frame 110 comprises a first connection pin 111, a second connection pin 112, and a third metal connection portion 113. The third metal connection portion 113 is connected between the first connection pin 111 and the second connection pin 112, preventing the first connection pin 111 from excessively separating from the second connection pin 112. In this embodiment, the first connection pin 111 and second connection pin 112 serve as a negative connection pin and a positive connection pin, respectively. Furthermore, a free end 111a of the first connection pin 111 is adjacent to a free end 112a of the second connection pin 112, and a reflective cup 111b is formed on the free end 111a of the first connection pin 111.

Next, multiple light-emitting diode chips 130 are respectively disposed in the reflective cups 111b of the first connection pins 111 of the metal frames 110 and are electrically connected thereto. Namely, each light-emitting diode chip 130 is disposed in the reflective cup 111b of each first connection pin 111.

Next, an electrode of each light-emitting diode chip 130 is electrically connected to the corresponding second connection pin 112 by a metal wire 140. In this embodiment, each light-emitting diode chip 130 is electrically connected to the corresponding first connection pin 111 by different ways, depending on the position of the electrode of the light-emitting diode chip. For example, as illustrated in FIG. 2, the electrode of each light-emitting diode chip 130 is directly electrically connected to the corresponding first connection pin 111. However, in another embodiment, each light-emitting diode chip 130 may be electrically connected to the corresponding first connection pin 111 by a metal wire (not shown). Specifically, the metal wire 140 is connected between the light-emitting diode chip 130 disposed on each first connection pin 111 and each second connection pin 112.

Next, the free end 111a of each first connection pin 111 is bound to the free end 112a of each corresponding second connection pin 112 with an adhesive 150, fixing the position thereof. If the free end 111a of each first connection pin 111 is excessively separated from the free end 112a of each corresponding second connection pin 112, the metal wire 140 could be pulled apart and subsequent processes would not be able to be performed on the metal frames 110. Additionally, the adhesive 150 must be non-conductive.

Figure 3:
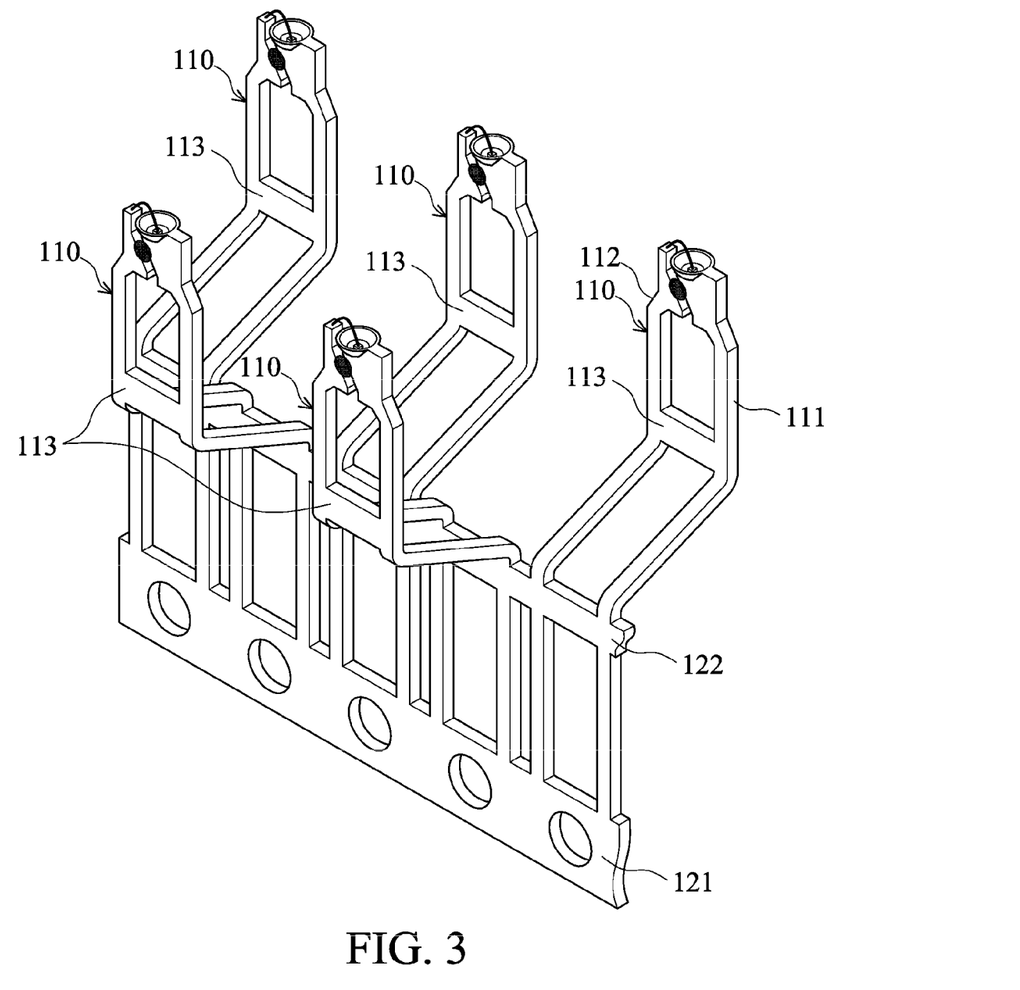
FIG. 3 is a schematic view showing an operational process of a method, for manufacturing light-emitting diode devices, of the invention.

Next, as shown in FIG. 3, the adjacent metal frames 110 are respectively bent in opposite directions, such that every two adjacent metal frames 110 are respectively located on two sides of the aforementioned plane and separate from each other. Here, each metal frame 110 is bent at a position near the second metal connection portion 122, and each metal frame 110 is then bent at a position near a third metal connection portion 113 connecting the first connection pin 111 to the second connection pin 112. In a preferred embodiment, the sequence of bending the metal frames 110 may be changed. Namely, each metal frame 110 is first bent at a position near a third metal connection portion 113, and each metal frame 110 is then bent at a position near the second metal connection portion 122.

Specifically, as shown in FIG. 3, when one of the adjacent metal frames 110 is bent away from the plane at a position near the second metal connection portion 122 in a first direction, the other of the adjacent metal frames 110 is bent away from the plane at a position near the second metal connection portion 122 in a second direction. Further description on bending of the metal frames is omitted for brevity and may be deduced by analogy. Here, the first direction is opposite to the second direction. Additionally, all the metal frames 110 are bent upward at the third metal connection portion 113. Thus, the metal frames 110 subjected to the aforementioned bending operation alternately separate from each other and are located on either side of the plane. Moreover, when the metal frames 110 are bent, malposition may occur between the first connection pin 111 and the second connection pin 112 due to a non-uniform applied force, easily causing breakage of the metal wire 140 connected between the first connection pin 111 and the second connection pin 112. Accordingly, by binding each first connection pin 111 to each second connection pin 112 with an adhesive 150, the malposition therebetween can be prevented, thus protecting the metal wire 140 from breakage due to pull and drag.

Figure 4A:
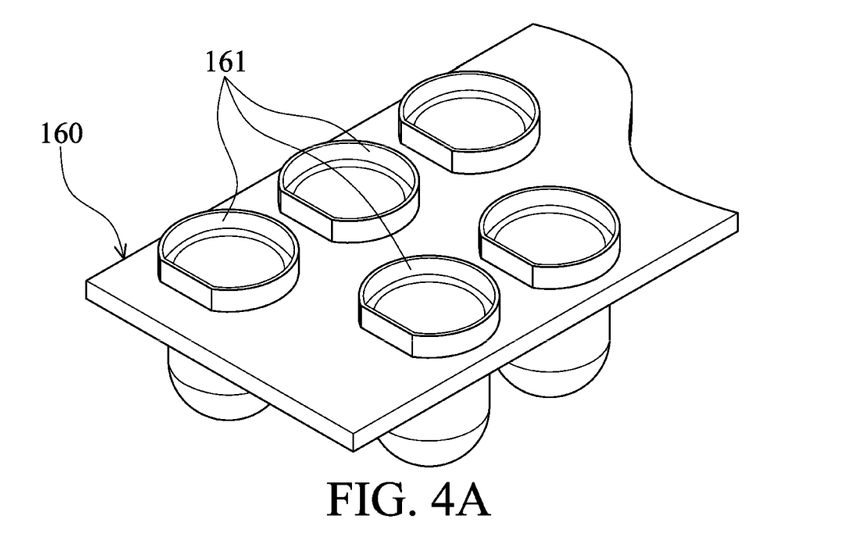
FIG. 4A is a schematic perspective view of a moldboard.
Figure 4B:
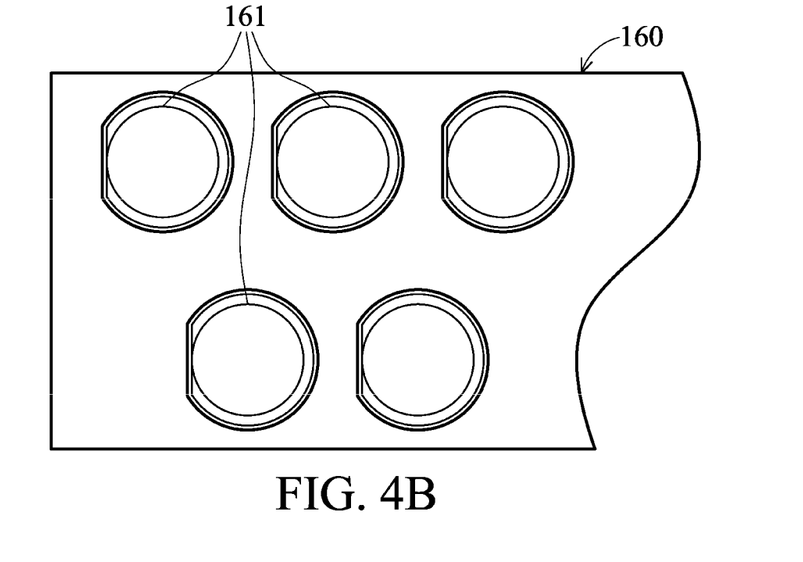
FIG. 4B is a schematic plane view of the moldboard.
Figure 5:
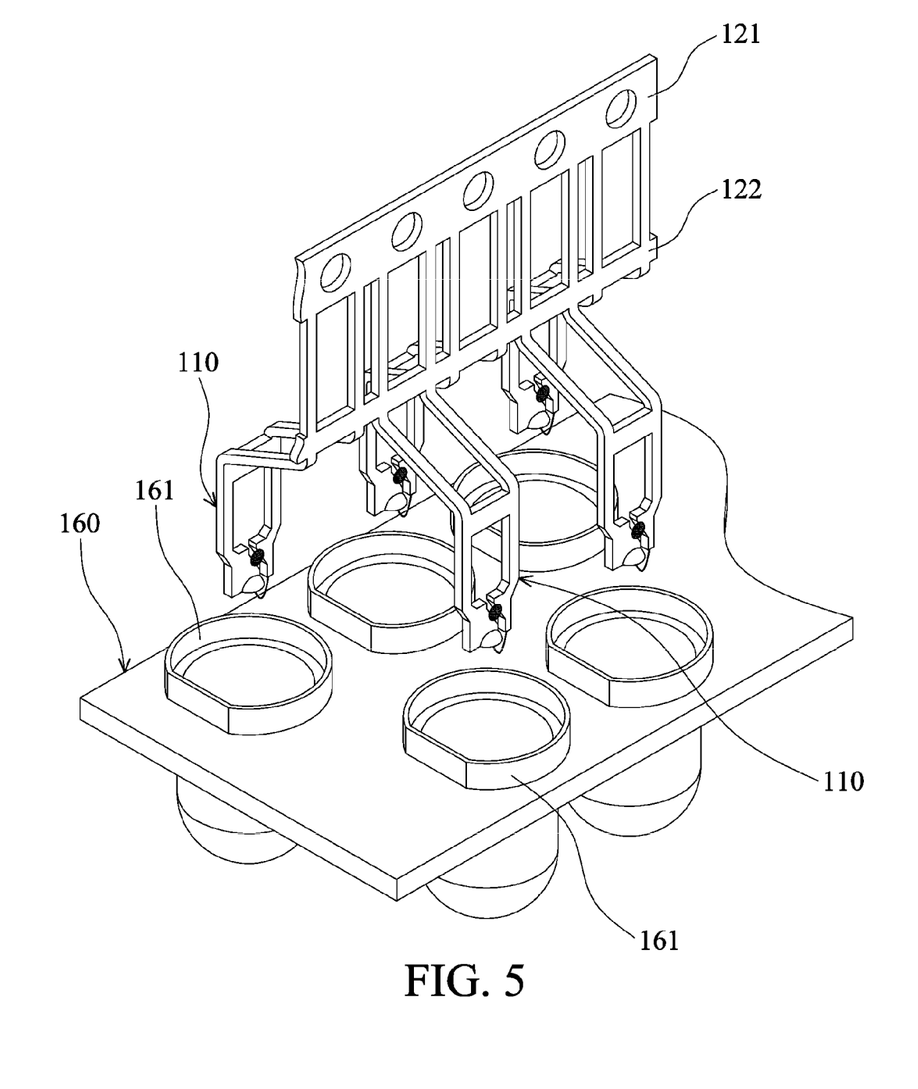
FIG. 5 is a schematic view showing another operational process of the method, for manufacturing the light-emitting diode devices, of the invention.

Next, as shown in FIG. 4A and FIG. 4B, a moldboard 160 formed with a plurality of mold cavities 161 is provided.

Figure 6:
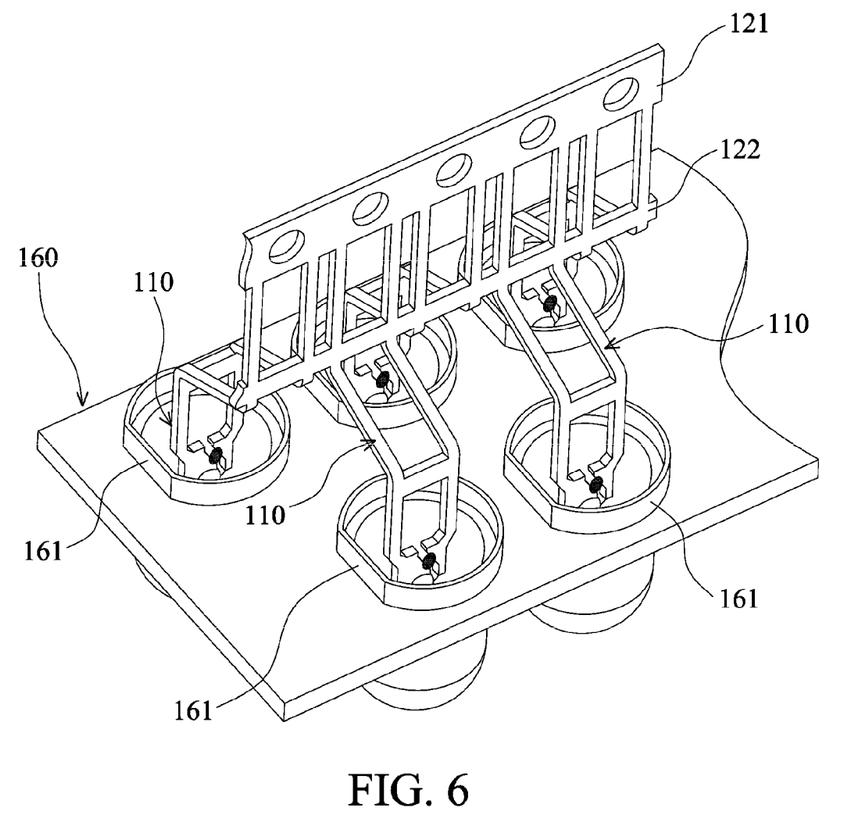
FIG. 6 is a schematic view showing yet another operational process of the method, for manufacturing the light-emitting diode devices, of the invention.

Next, as shown in FIG. 6, the free ends of the bent metal frames 110 are respectively disposed in the mold cavities 161, locating each light-emitting diode chip 130 in each mold cavity 161.

Figure 7:
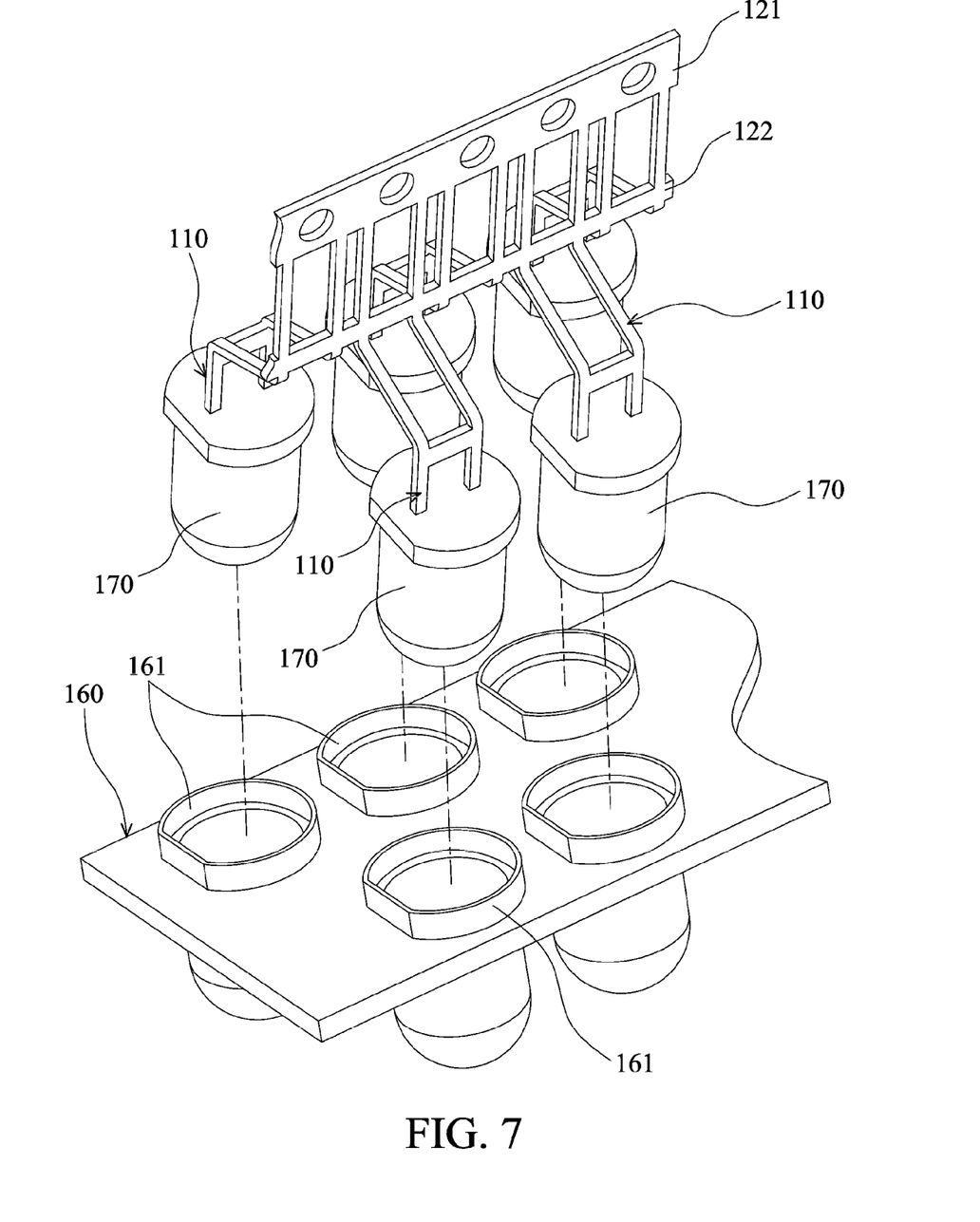
FIG. 7 is a schematic view showing still another operational process of the method, for manufacturing the light-emitting diode devices, of the invention.

Next, the mold cavities 161 are filled with package gel 170 (FIG. 7). Here, the package gel 170 covers each light-emitting diode chip 130.

Next, the package gel 170 is roasted and solidified (FIG. 7). Here, the way used to solidify the package gel 170 depends on the material thereof. For example, in another embodiment, the package gel is solidified by ultraviolet irradiation.

Next, as shown in FIG. 7, the mold cavities 161 are separated from the package gel 170.

Specifically, in another embodiment, the adjacent metal frames 110 are not limited to being located on different sides of the aforementioned plane. Namely, the adjacent metal frames 110 may be located on the same side of the plane and be separated from the plane by different distances. Alternatively, one of the adjacent metal frames 110 may be located on one side of the plane while the other may be located on the plane, as long as there is an enough space existing between the free ends of the two adjacent metal frames 110 and the free ends can be adequately disposed in the respective mold cavities 161. In yet another embodiment, to simplify subsequent processes, the bent metal frames 110 may have the substantially same height.

Figure 8:
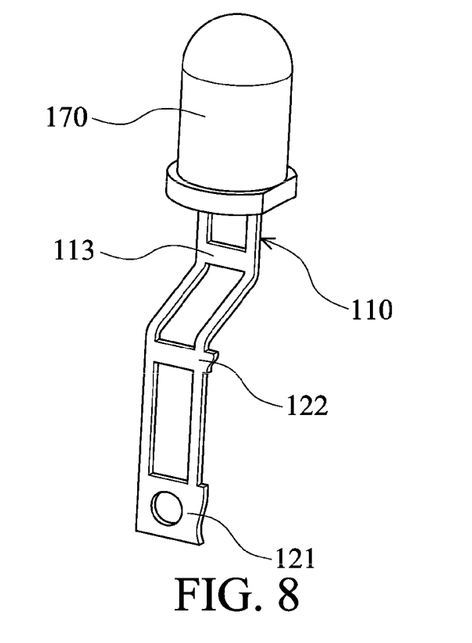
FIG. 8 is a schematic view showing still another operational process of the method, for manufacturing the light-emitting diode devices, of the invention.

Next, the metal frames 110 are separated from each other by cutting off the first metal connection portion 121 and second metal connection portion 122, forming the light-emitting diode devices, as shown in FIG. 8.

Figure 9:
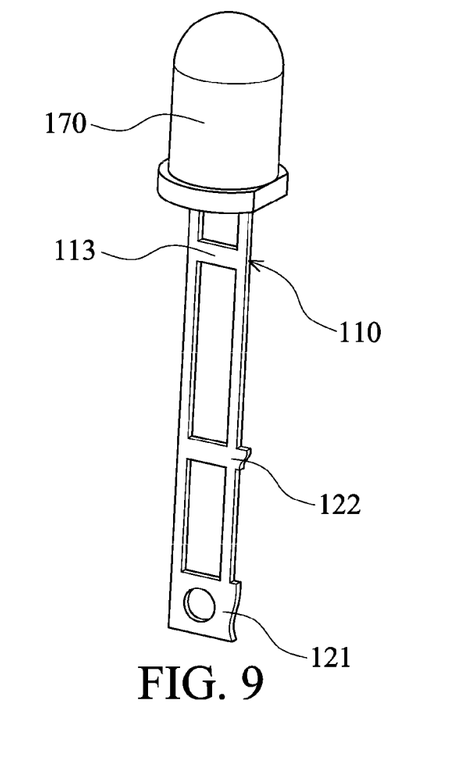
FIG. 9 is a schematic view showing still another operational process of the method, for manufacturing the light-emitting diode devices, of the invention.

Next, as shown in FIG. 9, the metal frame 110 of each light-emitting diode device is straightened.

Figure 10A:
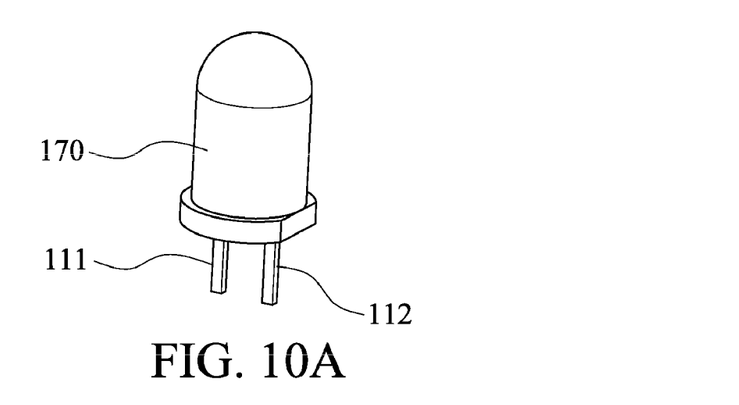
FIG. 10A is a schematic perspective view of a light-emitting diode device manufactured by the method of the invention.
Figure 10B:
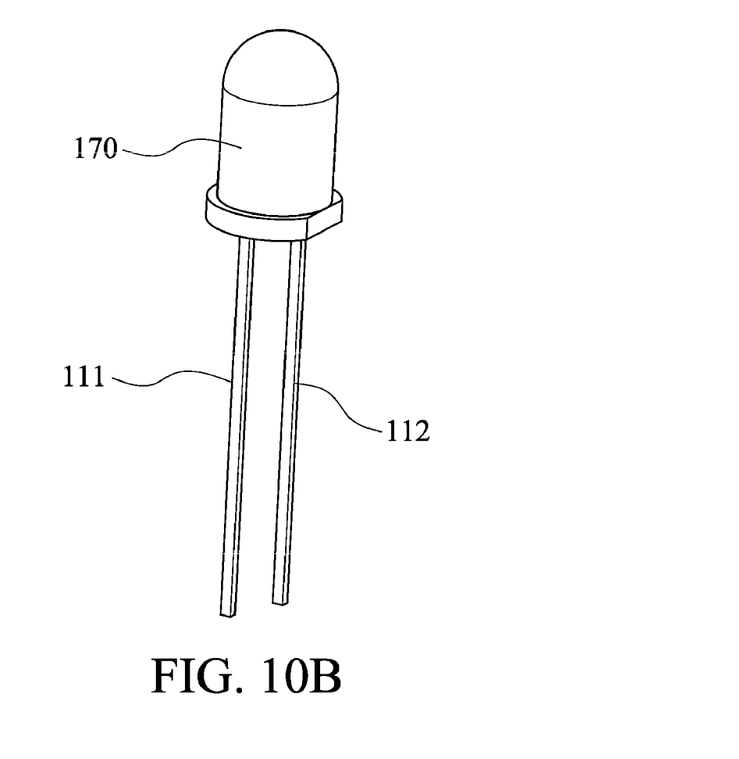
FIG. 10B is a schematic perspective view of another light-emitting diode device manufactured by the method of the invention.

Next, the metal frame 110 of each light-emitting diode device is cut off. Here, most of the metal frame 110 can be cut off, forming the light-emitting diode device with the short first connection pin 111 and second connection pin 112, as shown in FIG. 10A. In another aspect, most of the metal frame 110 may be selectively retained and the first metal connection portion 121, second metal connection portion 122, and third metal connection portion 113 are cut off, forming the light-emitting diode device with the long first connection pin 111 and second connection pin 112, as shown in FIG. 10B.

Figure 11:
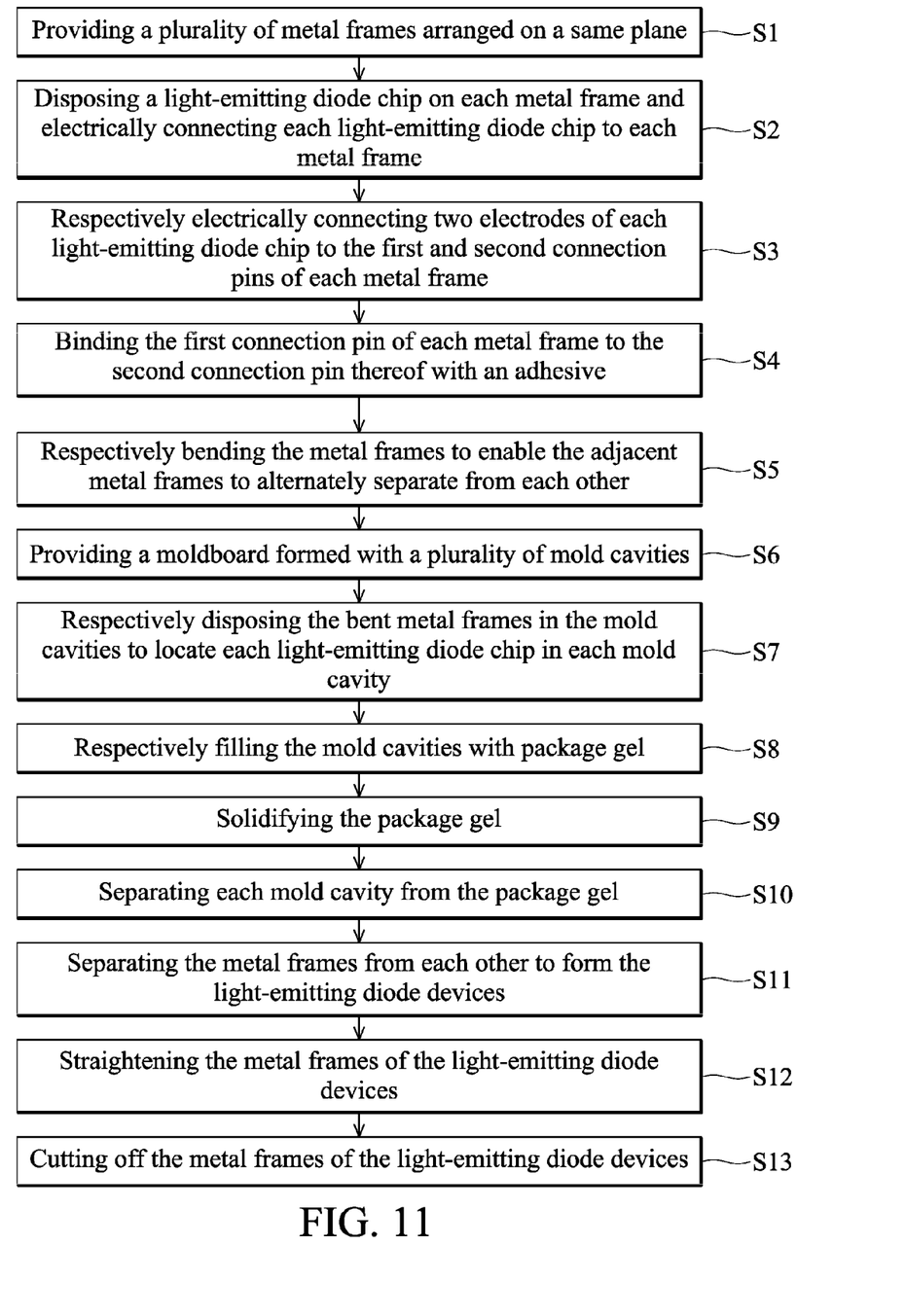
FIG. 11 is a flowchart showing the method, for manufacturing the light-emitting diode devices, of the invention.

Moreover, the aforementioned method for manufacturing light-emitting diode devices can be shown by steps S1 to S13 of FIG. 11.

Accordingly, in the disclosed method for manufacturing light-emitting diode devices, the metal frames 110 are respectively bent to alternately separate from each other and the alternately arranged mold cavities 161 are provided for filling of the package gel 170, such that interference between the mold cavities 161 can be prevented. Thus, the distance between the adjacent metal frames 110 can be reduced, thereby reducing the quantity of the material required by the first metal connection portion 121 and second metal connection portion 122. Accordingly, as the quantity of the material required by the first metal connection portion 121 and second metal connection portion 122 is reduced, the yield of the light-emitting diode devices can be increased and manufacturing costs thereof can be reduced.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for manufacturing light-emitting diode devices, comprising:
    providing a first metal frame and a second metal frame adjacent to each other and arranged on a same plane, and each of the first metal frame and the second metal frame comprises a plurality of connection pins;
    disposing a light-emitting diode chip on each metal frame and electrically connecting each light-emitting diode chip to each metal frame;
    bending all the connection pins of the first metal frame in a first direction with respect to the plane;
    bending all the connection pins of the second metal frame in a second direction opposite to the first direction, to separate the first metal frame and the second metal frame from each other;
    providing a moldboard formed with a plurality of mold cavities;
    respectively disposing the bent first metal frame and the second metal frame in the mold cavities to locate each light-emitting diode chip in each mold cavity;
    respectively filling the mold cavities with package gel, wherein the package gel filled in each mold cavity covers each light-emitting diode chip;
    solidifying the package gel;
    separating each mold cavity from the package gel; and
    detaching the first metal frame and the second metal frame from each other to form the light-emitting diode devices.

2. The method as claimed in claim 1, further comprising binding the connection pins of the first metal frame and the second metal frame with an adhesive.

3. The method as claimed in claim 1, wherein the first metal frame and the second metal frame are connected to each other by a first metal connection portion and a second metal connection portion.

4. The method as claimed in claim 3, further comprising steps, for respectively bending the first metal frame and the second metal frame metal, of:
    bending each of the first metal frame and the second metal frame at a position near the second metal connection portion; and
    bending each of the first metal frame and the second metal frame at a position near a third metal connection portion connecting the connection pins of each respective frame to each other.

5. The method as claimed in claim 1, wherein the first metal frame and the second metal frame have the substantially same height.

6. The method as claimed in claim 1, wherein two electrodes of each light-emitting diode chip are electrically connected to the connection pins of each of the first metal frame and the second metal frame, respectively.

7. The method as claimed in claim 6, wherein each light-emitting diode chip is disposed on a first connection pin of each . . . and is electrically connected to a second connection pin of each . . . of the first metal frame and the second metal frame by a metal wire.

8. The method as claimed in claim 1, further comprising straightening the first metal frame and the second metal frame of the light-emitting diode devices.

9. The method as claimed in claim 1, further comprising cutting off the first metal frame and the second metal frame of the light-emitting diode devices from a metal connection portion that connects the metal frames.

10. The method as claimed in claim 1, wherein the package gel is solidified by heating or ultraviolet irradiation in solidifying the package gel.

11. The method as claimed in claim 2, wherein the adhesive is non-conductive.

* * * * *